(12) United States Patent
Chai et al.

(10) Patent No.: US 8,901,944 B2
(45) Date of Patent: Dec. 2, 2014

(54) LATTICE STRUCTURE FOR CAPACITANCE SENSING ELECTRODES

(75) Inventors: Min Chin Chai, Lynnwood, WA (US); Patrick Prendergast, Clinton, WA (US); Tao Peng, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 491 days.

(21) Appl. No.: 13/198,717

(22) Filed: Aug. 5, 2011

(65) Prior Publication Data

US 2011/0316567 A1 Dec. 29, 2011

Related U.S. Application Data

(63) Continuation-in-part of application No. 13/008,014, filed on Jan. 18, 2011.

(60) Provisional application No. 61/372,002, filed on Aug. 9, 2010, provisional application No. 61/295,559, filed on Jan. 15, 2010.

(51) Int. Cl.
  *G01R 27/26* (2006.01)
  *G06F 3/041* (2006.01)
  *G06F 3/045* (2006.01)
  *H03K 17/96* (2006.01)
  *G06F 3/044* (2006.01)

(52) U.S. Cl.
  CPC .............. *H03K 17/9622* (2013.01); *H03K 2217/960775* (2013.01); *G06F 3/044* (2013.01)
  USPC ........... 324/686; 324/658; 324/666; 345/173; 345/174

(58) Field of Classification Search
  CPC .............. G06F 3/041; G01R 27/2605; H03K 2017/9602; H03K 17/962; H03K 2217/960775
  USPC ................... 324/686; 361/280; 345/173, 174
  See application file for complete search history.

(56) References Cited

U.S. PATENT DOCUMENTS 5,099,386 A  *  3/1992  Stokes et al. ............... 361/298.5
6,188,391 B1     2/2001  Seely et al.
(Continued)

FOREIGN PATENT DOCUMENTS

| | | |
|---|---|---|
| JP | 2010002958 A | 1/2010 |
| KR | 20100031242 A | 3/2010 |
| KR | 20100070964 A | 6/2010 |

OTHER PUBLICATIONS

Lee, M. The Art of Capacitive Touch Sensing. EE Times, Design Article [online]. Mar. 1, 2006 [retrieved on Aug. 4, 2011]. Retrieved from the Internet <URL:http://www.eetimes.com/design/analog-design/4009622/The-art-of-capacitive-touch-sensing>.

(Continued)

*Primary Examiner* — Jermele M Hollington
*Assistant Examiner* — Christopher McAndrew

(57) ABSTRACT

One embodiment of a capacitive sensor array may comprise a first plurality of sensor elements and a second sensor element comprising a main trace, where the main trace intersects each of the first plurality of sensor elements to form a plurality of intersections. A unit cell may be associated with each of the intersections, and each unit cell may designate a set of locations nearest to the corresponding intersection. A contiguous section of the main trace may cross at least one of the plurality of unit cells. Within each unit cell, the second sensor element may comprise at least one primary subtrace branching away from the main trace.

20 Claims, 8 Drawing Sheets

(56) References Cited

U.S. PATENT DOCUMENTS

| | | |
|---|---|---|
| 6,627,154 B1 | 9/2003 | Goodman et al. |
| 6,642,857 B1 * | 11/2003 | Schediwy et al. ............. 341/20 |
| 6,925,611 B2 | 8/2005 | SanGiovanni |
| 7,030,860 B1 * | 4/2006 | Hsu et al. ...................... 345/173 |
| 7,129,935 B2 * | 10/2006 | Mackey ........................ 345/174 |
| 7,202,859 B1 * | 4/2007 | Speck et al. .................. 345/174 |
| 7,453,270 B2 * | 11/2008 | Hargreaves et al. .......... 324/686 |
| 7,463,246 B2 * | 12/2008 | Mackey ........................ 345/173 |
| 7,663,607 B2 | 2/2010 | Hotelling et al. |
| 7,808,255 B2 * | 10/2010 | Hristov et al. ................ 324/686 |
| 7,859,521 B2 | 12/2010 | Hotelling et al. |
| 7,920,129 B2 | 4/2011 | Hotelling et al. |
| 7,932,898 B2 | 4/2011 | Philipp et al. |
| 7,940,251 B2 | 5/2011 | Hashida |
| 7,965,281 B2 | 6/2011 | Mackey |
| 8,217,916 B2 | 7/2012 | Anno |
| 8,410,795 B1 | 4/2013 | Peng et al. |
| 2002/0015024 A1 | 2/2002 | Westerman et al. |
| 2002/0098119 A1 | 7/2002 | Goodman |
| 2004/0130336 A1 * | 7/2004 | Picollet et al. ................ 324/686 |
| 2004/0252109 A1 | 12/2004 | Trent et al. |
| 2007/0008299 A1 * | 1/2007 | Hristov ........................ 345/173 |
| 2007/0057167 A1 | 3/2007 | MacKey et al. |
| 2007/0139395 A1 | 6/2007 | Westerman et al. |
| 2007/0176608 A1 | 8/2007 | Mackey et al. |
| 2007/0229470 A1 * | 10/2007 | Snyder et al. ................ 345/173 |
| 2008/0007534 A1 | 1/2008 | Peng et al. |
| 2008/0048997 A1 | 2/2008 | Gillespie et al. |
| 2008/0111795 A1 | 5/2008 | Bollinger |
| 2008/0225015 A1 | 9/2008 | Hashida |
| 2008/0246496 A1 * | 10/2008 | Hristov et al. ................ 324/686 |
| 2008/0264699 A1 | 10/2008 | Chang et al. |
| 2008/0278178 A1 | 11/2008 | Philipp |
| 2009/0051863 A1 | 2/2009 | Meisner |
| 2009/0159344 A1 | 6/2009 | Hotelling et al. |
| 2009/0262092 A1 | 10/2009 | Halsey et al. |
| 2009/0273570 A1 | 11/2009 | Degner et al. |
| 2009/0309616 A1 | 12/2009 | Klinghult et al. |
| 2010/0020032 A1 | 1/2010 | Mamba et al. |
| 2010/0044122 A1 | 2/2010 | Sleeman et al. |
| 2010/0045632 A1 | 2/2010 | Yilmaz et al. |
| 2010/0059294 A1 | 3/2010 | Elias et al. |
| 2010/0128002 A1 | 5/2010 | Stacy et al. |
| 2010/0164881 A1 | 7/2010 | Kuo et al. |
| 2010/0182275 A1 | 7/2010 | Saitou |
| 2010/0201633 A1 | 8/2010 | Mozdzyn et al. |
| 2010/0224424 A1 | 9/2010 | Kasajima |
| 2010/0231555 A1 | 9/2010 | Mackey |
| 2010/0292945 A1 | 11/2010 | Reynolds et al. |
| 2010/0302201 A1 | 12/2010 | Ritter et al. |
| 2010/0302206 A1 | 12/2010 | Yu et al. |
| 2010/0328255 A1 | 12/2010 | Ishizaki et al. |
| 2011/0001723 A1 | 1/2011 | Fan |
| 2011/0012842 A1 | 1/2011 | Lee et al. |
| 2011/0261003 A1 | 10/2011 | Lee et al. |
| 2011/0316567 A1 | 12/2011 | Chai et al. |
| 2012/0044193 A1 | 2/2012 | Peng et al. |
| 2012/0044198 A1 | 2/2012 | Chai et al. |
| 2012/0133611 A1 | 5/2012 | Chai et al. |
| 2012/0229417 A1 | 9/2012 | Badaye |
| 2013/0169582 A1 | 7/2013 | Ryshtun |

OTHER PUBLICATIONS

Barrett, G. Projected-Capacitive Touch Technology. Information Display [online]. Mar. 2010, vol. 26 No. 3, p. 16-21 [retrieved on Aug. 4, 2011]. Retrieved from the Internet <URL:http://walkermobile.com/March_2010_Information_Display_Magazine.pdf>.

International Search Report and Written Opinion of the International Searching Authority for International Application No. PCT/US11/47094 dated Feb. 23, 2012; 6 pages.

International Search Report for International Application No. PCT/US11/66509 dated Apr. 19, 2012; 2 pages.

Jing Wu, et al., "A High Sensitivity Capacitive Fingerprint Sensor with Double Sensing Plates", IEEE Xplore, Oct. 2004; accessed from http://ieeexplore.ieee.org/xpl/freeabs_all.jsp?reload=true&arnumber=1436920 ; 4 pages.

USPTO Advisory Action for U.S. Appl. No. 13/247,922 dated May 16, 2014; 3 pages.

USPTO Final Rejection for U.S. Appl. No. 13/247,922 dated Mar. 12, 2014; 20 pages.

USPTO Non Final Rejection for U.S. Appl. No. 13/247,922 dated Oct. 3, 2013; 20 pages.

USPTO Non-Final Rejection for U.S. Appl. No. 13/008,014 dated Aug. 19, 2014; 12 pages.

USPTO Non-Final Rejection for U.S. Appl. No. 13/247,922 dated Aug. 15, 2014; 21 pages.

USPTO Notice of Allowance for U.S. Appl. No. 13/247,867 dated Oct. 21, 2013; 10 pages.

Written Opinion of the International Searching Authority for International Application No. PCT/US11/66509 mailed Apr. 19, 2012; 6 pages.

* cited by examiner

LATTICE STRUCTURE FOR CAPACITANCE SENSING ELECTRODES

RELATED APPLICATIONS

This application claims the benefit of U.S. Provisional Application No. 61/372,002, filed on Aug. 9, 2010, and is a continuation in part of U.S. patent application Ser. No. 13/008,014, filed on Jan. 18, 2011, which claims priority to U.S. Provisional Application No. 61/295,559, filed on Jan. 15, 2010, all of which are hereby incorporated by reference.

TECHNICAL FIELD

This disclosure relates to the field of touch-sensors and, in particular, to trace patterns of elements in capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

An embodiment of a capacitive sensor array may include sensor elements arranged such that each unit cell corresponding to an intersection between sensor elements may include a main trace and one or more primary subtraces branching away from the main trace. In one embodiment, a sensor element may also include one or more secondary subtraces branching from a primary subtrace, or one or more tertiary subtraces branching from a secondary subtrace. In one embodiment, a sensor array having such a pattern may have decreased signal disparity and reduced manufacturability problems as compared to other patterns, such as a diamond pattern. Specifically, a capacitive sensor array with sensor elements having main traces and subtraces branching from the main trace, such as a totem pole pattern, may be manufactured with decreased cost and increased yield rate, as well as improved optical quality.

An embodiment of such a capacitive sensor array may include a first and a second plurality of sensor elements each intersecting each of the first plurality of sensor elements. Each intersection between one of the first plurality of sensor elements and one of the second plurality of sensor elements may be associated with a corresponding unit cell. In one embodiment, a unit cell corresponding to an intersection may be understood as an area including all locations on the surface of the sensor array that are nearer to the corresponding intersection than to any other intersection between sensor elements.

In one embodiment of a capacitive sensor array, each of the second plurality of sensor elements includes a main trace that crosses at least one of the plurality of unit cells, and further includes, within each unit cell, a primary subtrace that branches away from the main trace. In one embodiment, the primary subtrace may be one of two or more primary subtraces branching symmetrically from opposite sides of the main trace, resembling a "totem pole". Alternatively, the primary subtraces may branch asymmetrically from the main trace.

Figure 1:
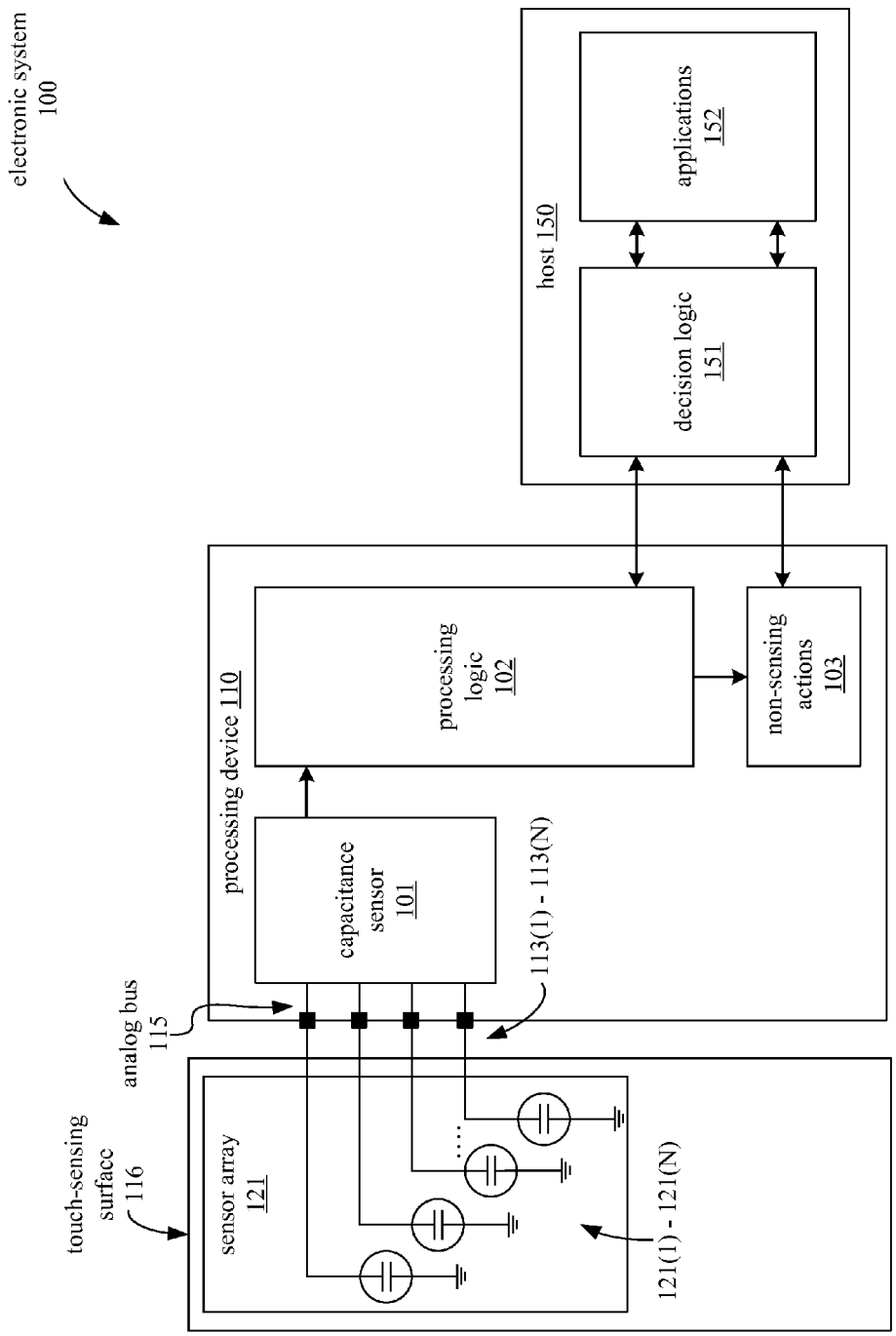
FIG. 1 is a block diagram illustrating an embodiment of an electronic system that processes touch sensor data.

FIG. 1 illustrates a block diagram of one embodiment of an electronic system 100 including a processing device 110 that may be configured to measure capacitances from a touch sensing surface 116 including a capacitive sensor array as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor elements 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor element 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The capacitance sensor 101 may further include software components to convert the count value (e.g., capacitance value) into a sensor element detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
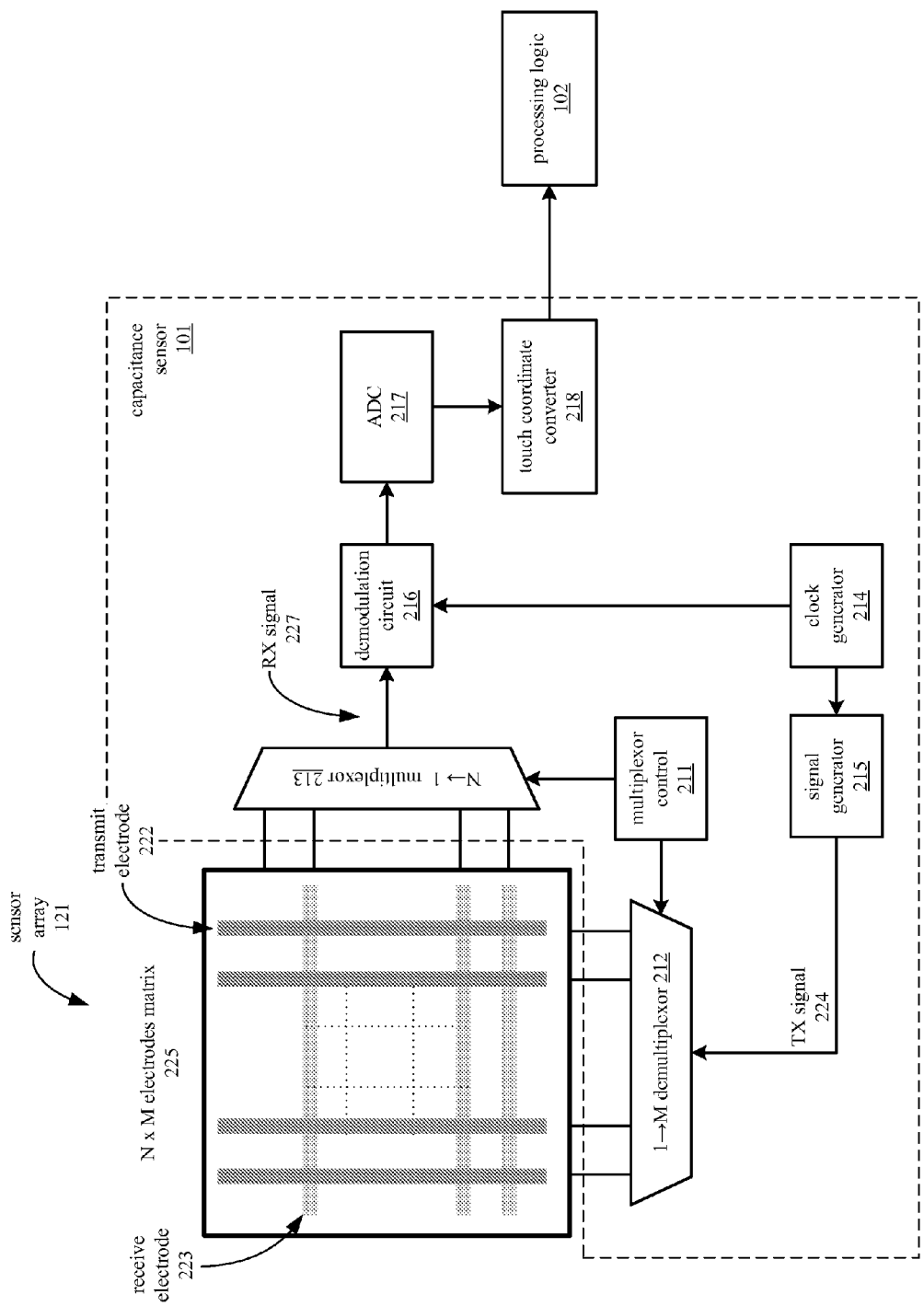
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts measured capacitances to coordinates. The coordinates are calculated based on measured capacitances. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 outputs a signal to the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a decrease in the mutual capacitance between only some of the electrodes. For example, if a finger is placed near the intersection of transmit electrode 222 and receive electrode 223, the presence of the finger will decrease the mutual capacitance between electrodes 222 and 223. Thus, the location of the finger on the touchpad can be determined by identifying the one or more receive electrodes having a decreased mutual capacitance in addition to identifying the transmit electrode to which the TX signal 224 was applied at the time the decreased mutual capacitance was measured on the one or more receive electrodes.

By determining the mutual capacitances associated with each intersection of electrodes in the matrix 225, the locations of one or more touch contacts may be determined. The determination may be sequential, in parallel, or may occur more frequently at commonly used electrodes.

In alternative embodiments, other methods for detecting the presence of a finger or conductive object may be used where the finger or conductive object causes an increase in capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined from the locations of one or more electrodes at which an increased capacitance is detected.

The induced current signal 227 is rectified by demodulation circuit 216. The rectified current output by demodulation circuit 216 can then be filtered and converted to a digital code by ADC 217.

The digital code is converted to touch coordinates indicating a position of an input on touch sensor array 121 by touch coordinate converter 218. The touch coordinates are transmitted as an input signal to the processing logic 102. In one embodiment, the input signal is received at an input to the processing logic 102. In one embodiment, the input may be configured to receive capacitance measurements indicating a plurality of row coordinates and a plurality of column coordinates. Alternatively, the input may be configured to receive row coordinates and column coordinates.

In one embodiment, the sensor array 121 can be configured to detect multiple touches. One technique for multi-touch detection uses a two-axis implementation: one axis to support rows and another axis to support columns. Additional axes, such as a diagonal axis, implemented on the surface using additional layers, can allow resolution of additional touches.

Figure 3A:
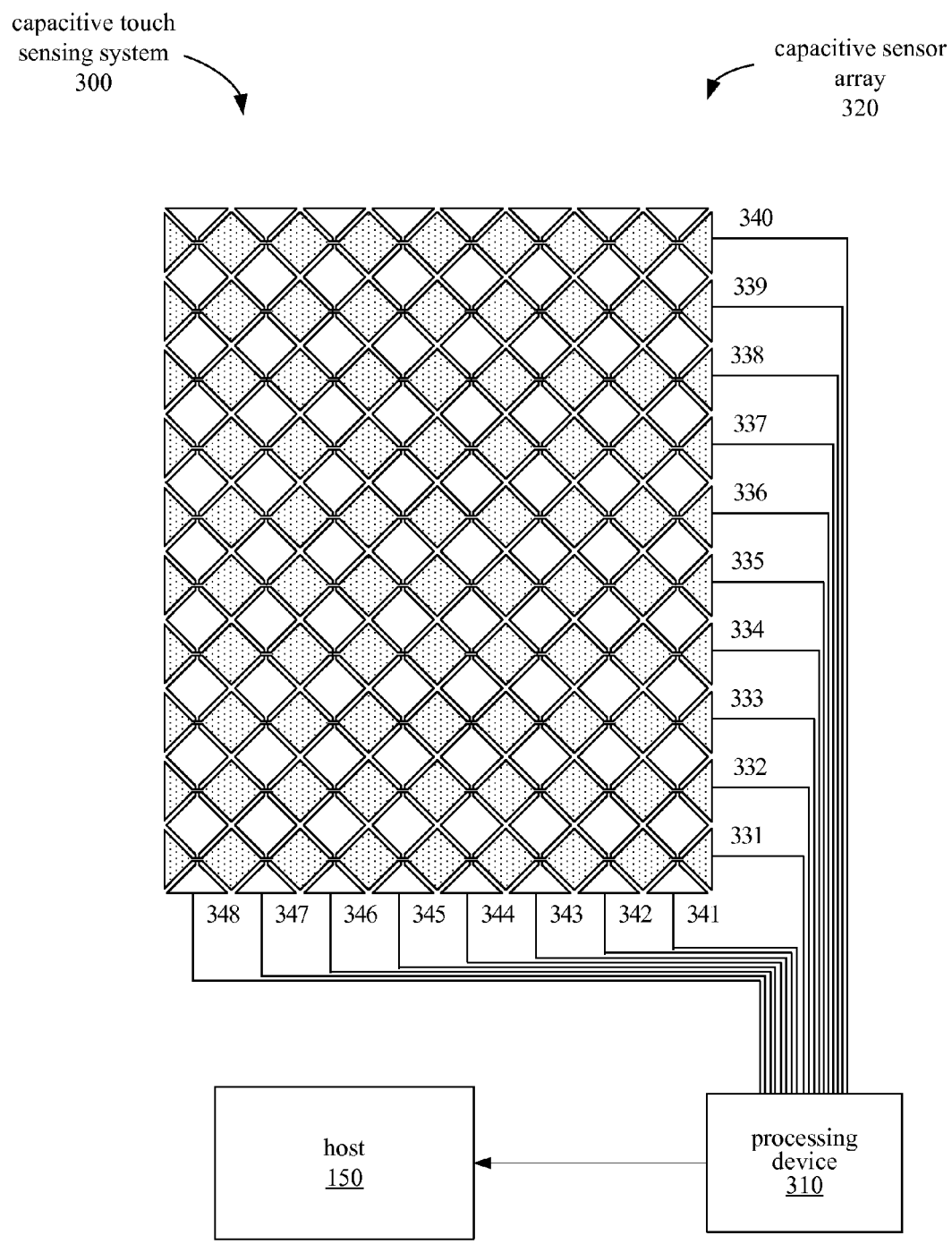
FIG. 3A illustrates an embodiment of a capacitive sensor array having a diamond pattern.

FIG. 3A illustrates an embodiment of a capacitive touch sensing system 300 that includes a capacitive sensor array 320. Capacitive sensor array 320 includes a plurality of row sensor elements 331-340 and a plurality of column sensor elements 341-348. The row and column sensor elements 331-348 are connected to a processing device 310, which may include the functionality of capacitance sensor 101, as illustrated in FIG. 2. In one embodiment, the processing device 310 may perform TX-RX scans of the capacitive sensor array 320 to measure a mutual capacitance value associated with each of the intersections between a row sensor element and a column sensor element in the sensor array 320. The measured capacitances may be further processed to determine centroid locations of one or more contacts at the capacitive sensor array 320.

In one embodiment, the processing device 310 is connected to a host 150 which may receive the measured capacitances or calculated centroid locations from the processing device 310.

Figure 3B:
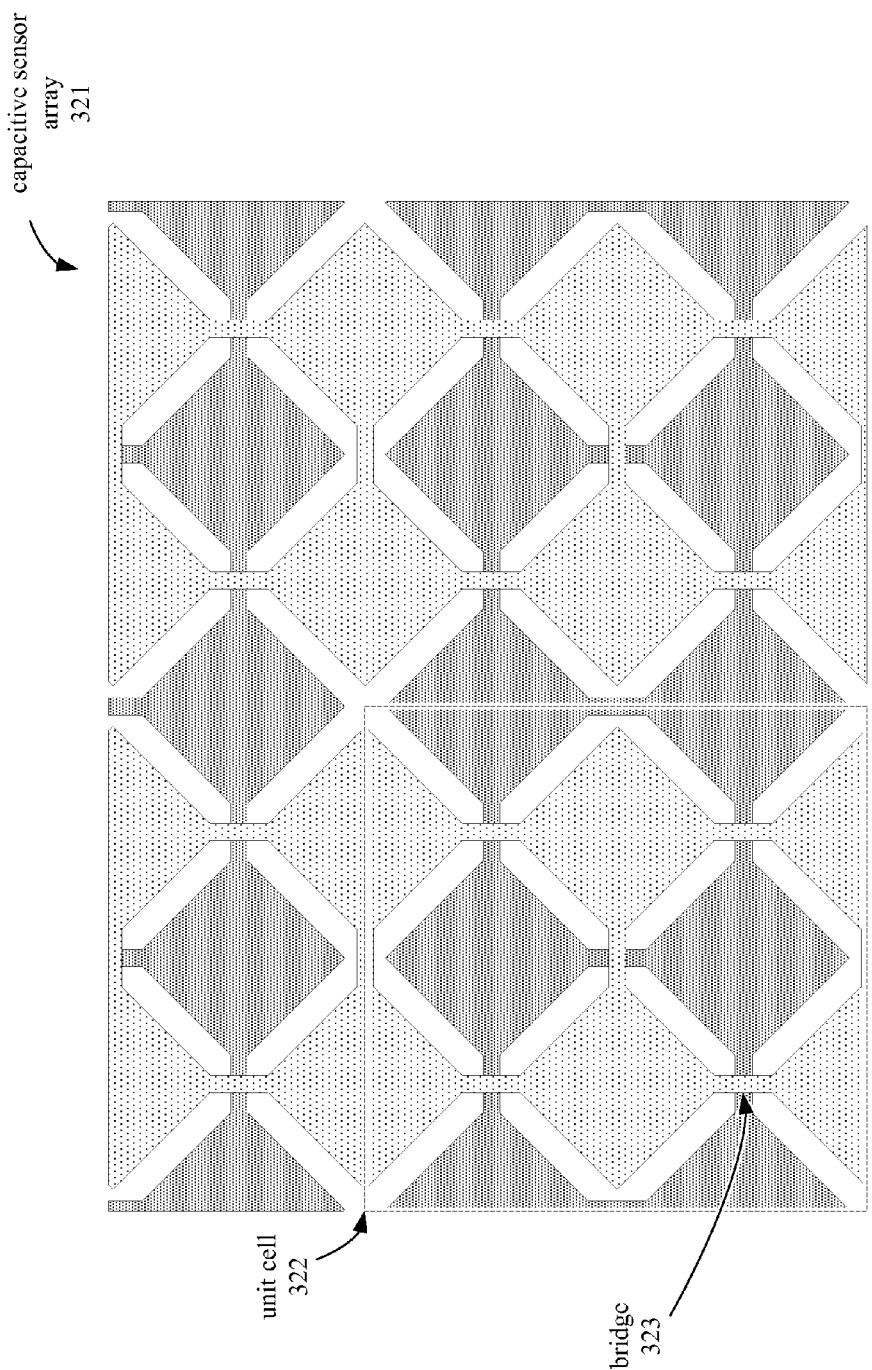
FIG. 3B illustrates a portion of a capacitive sensor array having a diamond pattern, according to an embodiment.

The sensor array 320 illustrated in FIG. 3A includes sensor elements arranged in a diamond pattern. Specifically, the sensor elements 331-348 of sensor array 320 are arranged in a single solid diamond (SSD) pattern. FIG. 3B illustrates a capacitive sensor array 321 having an alternate embodiment of the diamond pattern, which is the dual solid diamond (DSD) pattern. Each of the sensor elements of capacitive sensor array 321 includes two rows or columns of electrically connected diamond shaped traces. Relative to the SSD pattern, the DSD pattern has improved signal disparity characteristics due to an increase in the coupling between TX and RX sensor elements while maintaining the same self-capacitance coupling possible between each sensor element and a conductive object near the sensor element. However, the DSD pattern also increases the number of bridges used to create the pattern, which may result in decreased manufacturing yield. The increased number of bridges may also be visible if metal bridges are used.

Figure 4:
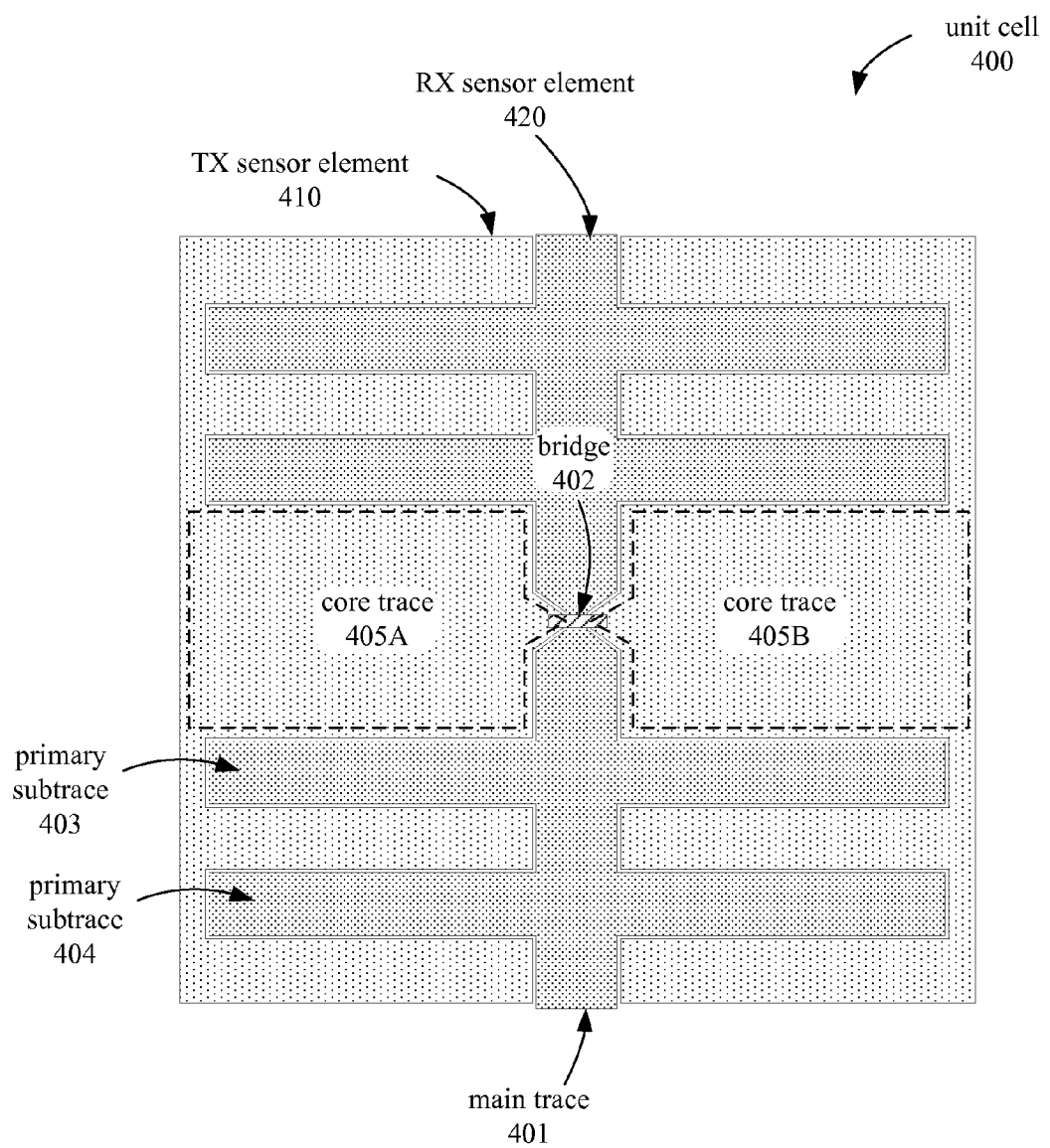
FIG. 4 illustrates a unit cell of a capacitive sensor array having a main trace and primary subtraces, according to an embodiment.

FIG. 4 illustrates one unit cell 400 of a pattern of sensor elements for a capacitive sensor array, according to an embodiment. Unit cell 400 includes portions of sensor elements 410 and 420. Sensor element 420 includes a main trace 401 that extends from one side of the unit cell to an opposite side of the unit cell. Sensor element 410 includes a core trace 405, which may further include separate portions 405A and 405B. In one embodiment, the core trace 405 may extend across the length of the unit cell.

In one embodiment, a bridge 402 is used to connect portions of the sensor element 410 on opposite sides of the main trace 401 of sensor element 420. For example, the bridge 402 connects the portions of the core trace 405A and 405B. In one embodiment, the bridge 402 is made from Indium Tin Oxide (ITO). Alternatively, the bridge 402 may be made from metal or some other conductive material. In one embodiment, the bridge may be manufactured in the same layer as the sensor element to which it is connected. For example, the bridge 402 may be manufactured as part of the same layer of material as sensor element 410. This may be the case where sensor elements 410 and 420 are in different layers. Alternatively, the sensor elements 410 and 420 may be in the same layer and the bridge 402 may be in a separate layer.

In an alternative embodiment, the bridge 402 may be used to connect portions of sensor element 420 rather than sensor element 410. In one embodiment, a metal bridge may be used to connect the portions of sensor element 420, to minimize the resistance of the RX sensor element 420.

Within the unit cell, a primary subtrace 403 branches away from the main trace 401. In one embodiment, only one end of the primary subtrace 403 is connected to the main trace 401. The sensor element 420 may also include primary subtraces in addition to primary subtrace 403, such as subtrace 404. These additional primary subtraces may also extend away from the main trace 401, and may be parallel to subtrace 403. For example, subtrace 404 branches away from the same side of main trace 401 as subtrace 403 and is parallel to subtrace 403. In one embodiment, the primary subtraces, including subtrace 403, may be symmetrical about an axis extending through main trace 401. In one embodiment, the primary subtraces may be orthogonal to main trace 401 at the junction between the primary subtraces and the main trace 401.

As compared to the single solid diamond (SSD) pattern, the sensor pattern illustrated in FIG. 4 is characterized by a greater boundary length between the sensor elements 410 and 420. This increased boundary length increases the capacitive coupling between the sensor elements 410 and 420, which results in a decreased signal disparity when compared to the SSD pattern.

As compared to the DSD pattern, the sensor pattern of FIG. 4 has fewer bridges per unit cell, which may result in an increased manufacturing yield rate. Fewer bridges may also be less visible than the greater number of bridges per unit cell of the DSD pattern, particularly in applications where the sensor array is used in a clear touch-sensing overlay application.

In one embodiment, the shape of the sensor element 410 conforms to the negative space around the shape of sensor element 420. In an alternative embodiment, the shape of sensor element 410 may be independent of the shape of sensor element 420, and portions of the different sensor elements may overlap.

In one embodiment, the layout of traces of sensor element 420 accommodates a core trace 405 of the sensor element 410. In embodiments where the sensor element 410 is made up of multiple connected traces, the core trace may be the widest trace of each sensor element. For example, sensor element 410 includes a core trace 405 that is wider than any of the other traces of which the sensor element 410 is comprised. In one embodiment, the width of the core trace 405 maintains a low resistance to facilitate current flow through the sensor element 410. In one embodiment, other characteristics of the core trace such as thickness or material may also be used to maintain the low resistance of the sensor element 410.

In one embodiment, the sensor element 410 may function as a transmit (TX) sensor element, while the sensor element 420 functions as a receive (RX) sensor element, as illustrated in FIG. 4. In an alternative embodiment, the sensor elements 410 and 420 may instead function as RX and TX sensor elements, respectively.

In contrast with diamond patterns such as SSD and DSD patterns, the pattern having a main trace and subtraces allows for more flexible scaling and sizing of the TX and RX sensor elements, as well as adjustment of the boundary length between the TX and RX elements. In one embodiment, the geometry of the sensor elements may be optimized for a particular application or sensing method. For example, the boundary length between the TX and RX sensor elements may be maximized for mutual capacitance sensing, which depends on the fringing electric field between the TX and RX sensor elements. For self-capacitance sensing, the pattern of sensor elements may be designed to maximize the area covered by a given sensor element. In one embodiment, the width of the main trace 401 may be increased to decrease the resistance of the sensor element 540, or decreased to increase the resistance.

Figure 5A:
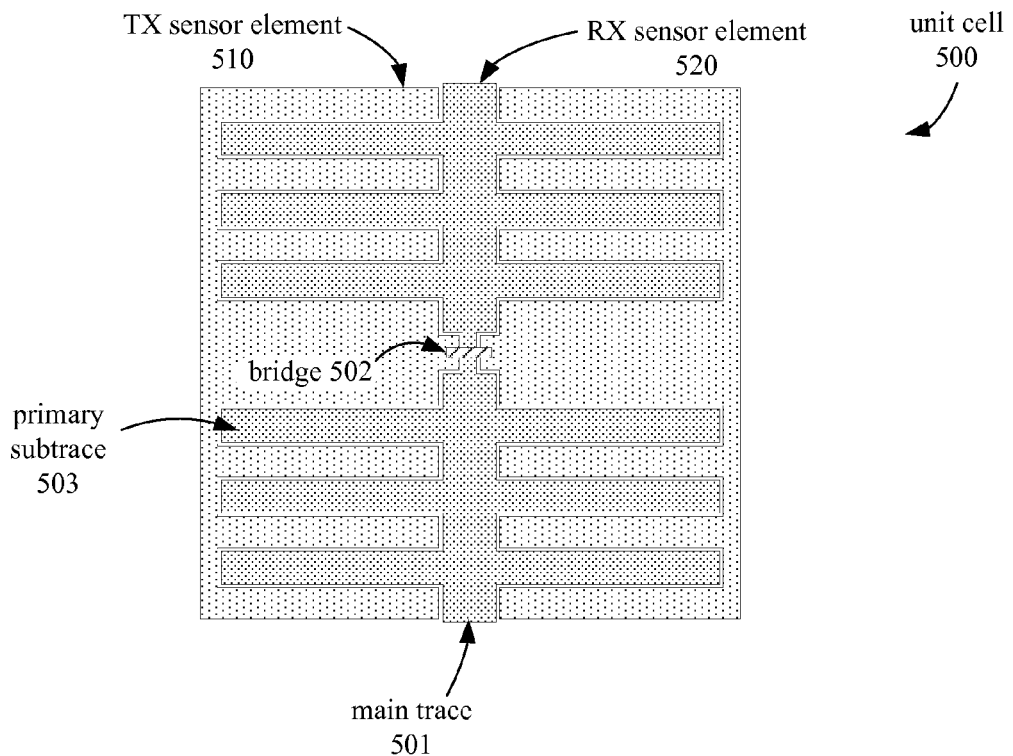
FIG. 5A illustrates a unit cell of a capacitive sensor array having a main trace and primary subtraces, according to an embodiment.

FIG. 5A illustrates a unit cell of a capacitive sensor array, according to an embodiment. Unit cell 500 includes portions of sensor elements 510 and 520. Sensor element 520 includes a main trace 501 extending from one side of the unit cell 500 to the other side of the unit cell 500. Bridge 502 crosses the main trace 501 to provide an electrical connection between portions of sensor element 510. A plurality of subtraces, such as primary subtrace 503, branch away from the main trace 501. In one embodiment, each of the primary subtraces may be connected to the main trace 501 at only one end, may be symmetrical about an axis extending through at least a portion of the main trace 501, and may be parallel to other primary subtraces.

As illustrated in FIG. 5A, the sensor element 510 may include twelve primary subtraces branching from the main trace 501, as compared to the eight primary subtraces illustrated in FIG. 4. Thus, between various embodiments, the number of subtraces per unit cell may be varied to optimize for different sensing methods. In some embodiments, the other dimensions of the main trace 501 and subtraces, such as the trace length and thickness, may also be varied for optimization purposes.

Figure 5B:
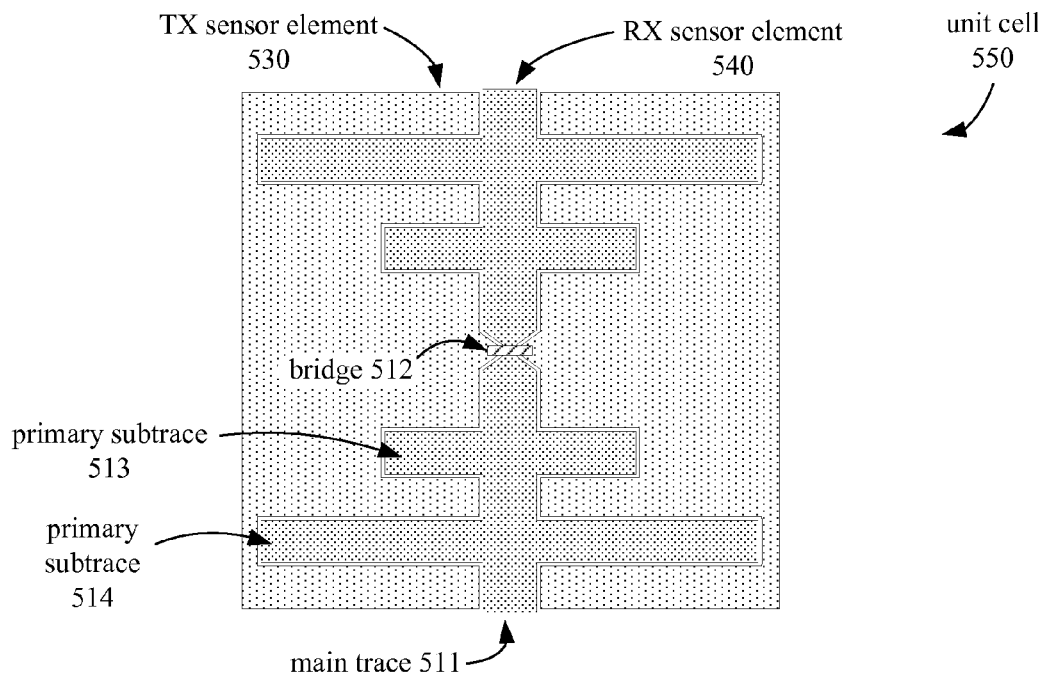
FIG. 5B illustrates a unit cell of a capacitive sensor array having a main trace and primary subtraces, according to an embodiment.

FIG. 5B illustrates a unit cell 550 of a capacitive sensor array having sensor elements 530 and 540. Sensor element 540 includes a main trace 511 that crosses the unit cell 550. Portions of sensor element 530 are connected via bridge 512. A plurality of primary subtraces, including subtraces 513 and 514, branch away from the main trace 511 within the unit cell 550. In one embodiment, some of the primary subtraces may be shorter than other subtraces. For example, primary subtrace 513 is shorter in length than subtrace 514. In one embodiment, the lengths of the subtraces may be adjusted to construct a sensor having specific characteristics. For example, the length of primary subtrace 513 may increased to increase the boundary length between the sensor elements 530 and 540, or to increase a ratio between the areas of the sensor element 540 and element 530.

Figure 6:
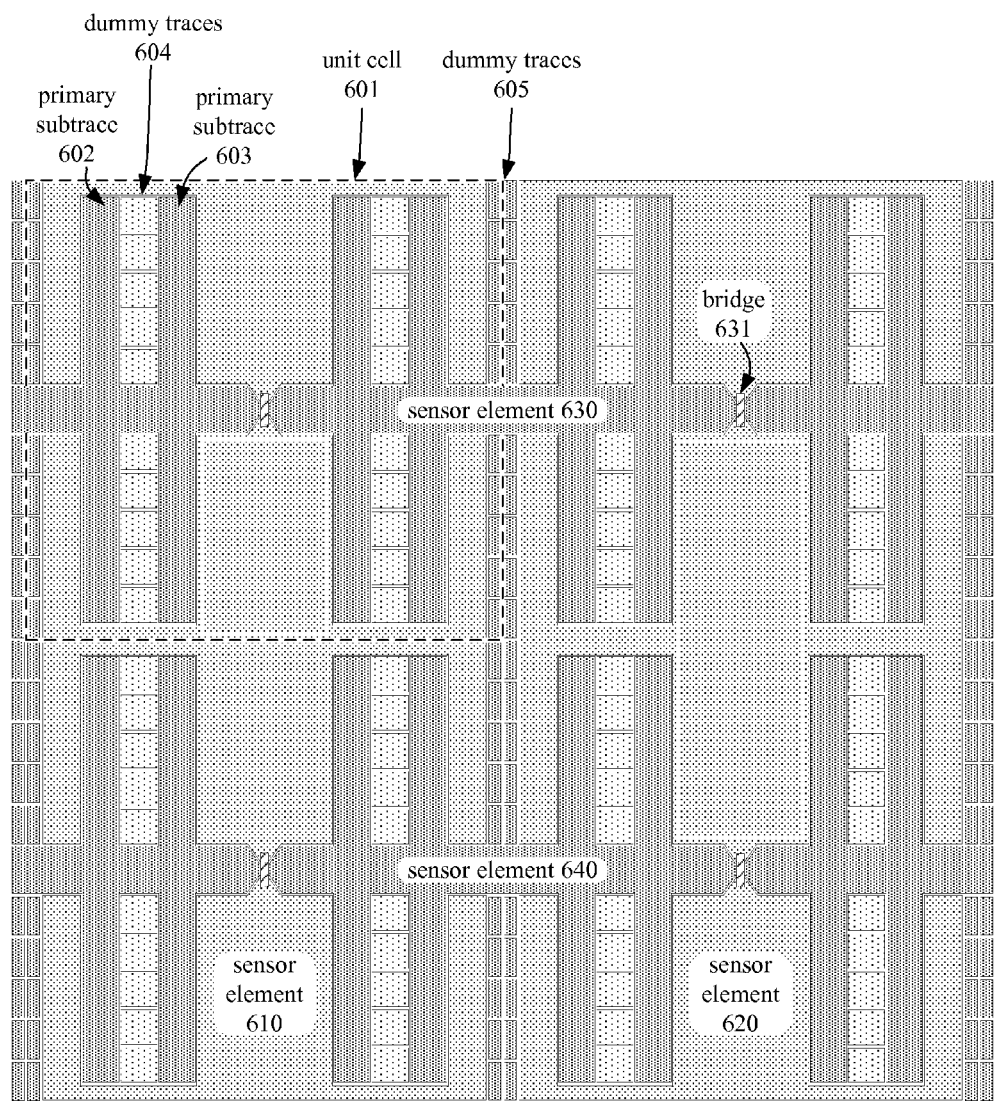
FIG. 6 illustrates four unit cells of a capacitive sensor array having dummy traces, according to an embodiment.

FIG. 6 illustrates four unit cells of a capacitive sensor array 600, including sensor elements 610 and 620 that intersect with sensor elements 630 and 640. In one embodiment, the sensor elements 630 and 640 may be RX sensor elements and the sensor elements 610 and 620 may be TX sensor elements. In one embodiment, bridges or jumpers, such as bridge 631, may be used to connect portions of the TX sensor elements 610 and 620.

In one embodiment, dummy traces may be used to reduce parasitic coupling between adjacent sensor elements. Dummy traces 605 may be made from conductive material, such as indium tin oxide (ITO), that is electrically isolated from the sensor elements.

In one embodiment, the dummy traces may be situated between the adjacent sensor elements. For example, dummy traces 605 are positioned in between the sensor elements 610 and 620. In one embodiment, the dummy traces 605 may be arranged in two rows between the sensor elements 610 and 620. Alternatively, the dummy traces 605 may be arranged in more or fewer than two rows. For example, the sensor elements may be separated by just one row of dummy traces.

In one embodiment, dummy traces may also be positioned between portions of the same sensor element to reduce parasitic mutual capacitance between intersecting sensor elements. For example, dummy traces 604 are placed between portions of sensor element 630 and 610 to reduce the parasitic mutual capacitance between sensor elements 630 and 610. In one embodiment, the dummy traces 604 may be positioned so that the dummy traces 604 do not obstruct the flow of current through one or more of the sensor elements, and the presence of the dummy traces 604 does not significantly increase the resistance of the sensor elements. For example, dummy traces 604 may be positioned between two primary subtraces 602 and 603 branching from a main trace of sensor element 630. Thus, the presence of the dummy traces 604 does not significantly obstruct the flow of current through sensor element 610.

Figure 7:
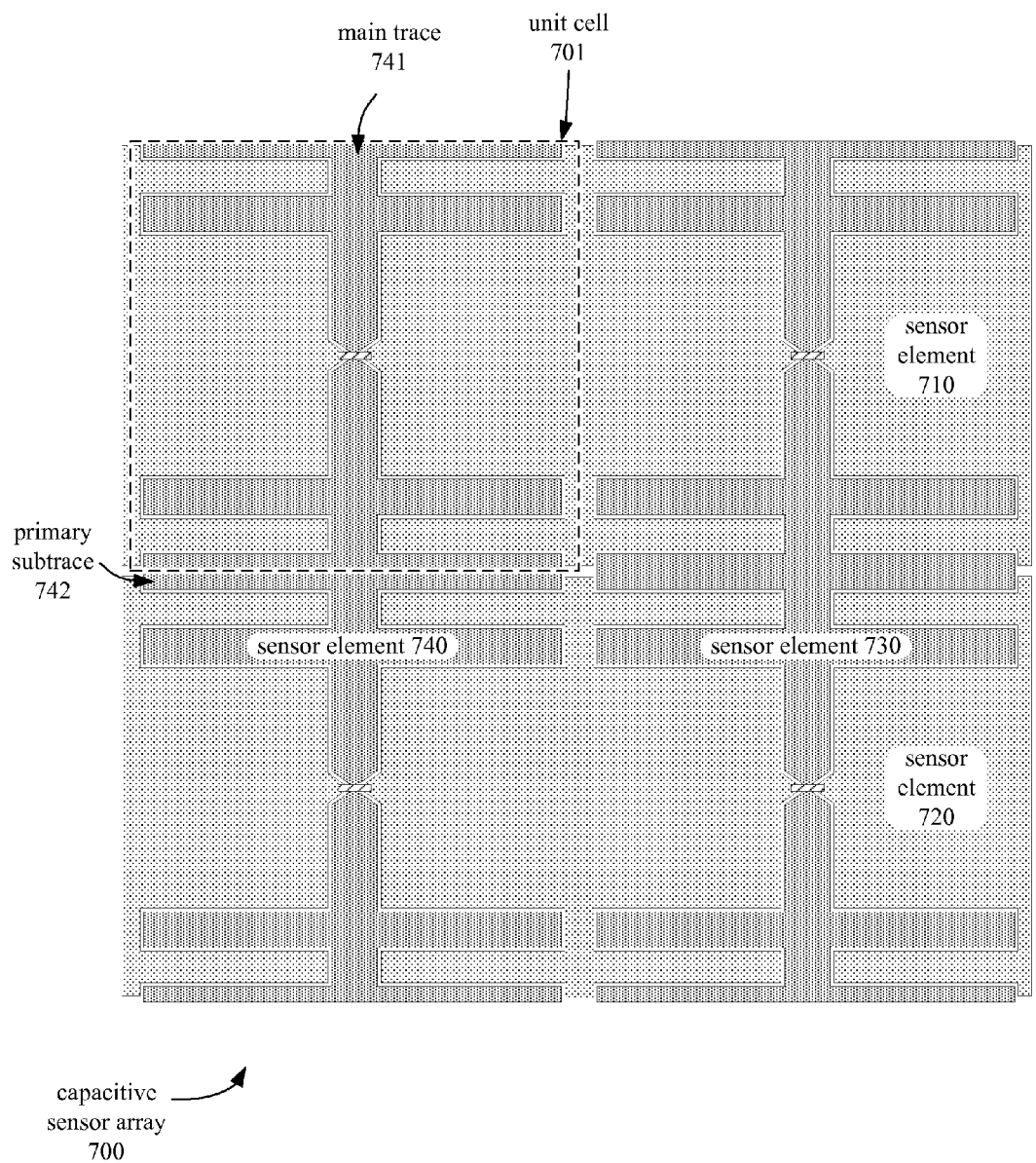
FIG. 7 illustrates four unit cells of a capacitive sensor array having a primary subtrace between two adjacent sensor elements, according to an embodiment.

FIG. 7 illustrates four unit cells of a capacitive sensor array that includes a primary subtrace that is positioned between adjacent sensor elements to reduce coupling capacitance between the adjacent sensor elements, according to an embodiment. Capacitive sensor array 700 includes sensor element 710 and 720 that each intersect with sensor elements 730 and 740. In one embodiment, the sensor elements 710 and 720 are TX sensor elements and the sensor elements 730 and 740 are RX sensor elements. Each of the sensor elements 730 and 740 may include a main trace and at least one primary subtrace, such as main trace 741 and primary subtrace 742 of sensor element 740.

In contrast with capacitive sensor array 600 illustrated in FIG. 6, sensor array 700 includes primary subtraces of column sensor element (rather than dummy traces) in between adjacent row sensor elements. For example, primary subtrace 742 may be situated between sensor elements 710 and 720. In one embodiment, primary subtraces may divide the entire boundary between sensor elements 710 and 720. Alternatively, the primary subtraces may divide only a part of the boundary between elements 710 and 720, as illustrated in FIG. 7. In one embodiment, the presence of the primary subtrace 742 between the sensor elements 710 and 720 reduces the capacitive coupling between sensor elements 710 and 720.

In addition to use in a touch-sensing application, the sensor patterns as illustrated in FIGS. 4-7 may be used to create a structure having a desired capacitance density for a specific footprint, due to the flexibility in sizing the area of the sensor elements and the boundary length between the sensor elements. For example, the sensor pattern may be used as an electrical test module in a silicon process where area-intensive and perimeter-intensive patterns may be used to extract a sidewall capacitance versus area capacitance of a process stackup.

In one embodiment, a capacitive sensor array pattern may include sensor elements having more than one main trace. For example, a RX sensor element may include two or more main traces to reduce the RX resistance.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitive sensor array, comprising:
   a first plurality of sensor elements each comprising a core trace, wherein for each sensor element of the first plurality of sensor elements, the core trace of the sensor element is wider than any other trace of the sensor element; and
   a second sensor element comprising a main trace, wherein the main trace crosses the core trace of each of the first plurality of sensor elements at a corresponding bridge to form a plurality of intersections each associated with a unit cell, wherein each of the plurality of unit cells designates a set of locations nearest a corresponding intersection, wherein a contiguous section of the main trace crosses at least one of the plurality of unit cells, wherein a contiguous section of the core trace of each of the first plurality of sensor elements crosses at least one of the plurality of unit cells, and wherein, within each unit cell, the second sensor element comprises at least one primary subtrace branching away from the main trace.

2. The capacitive sensor array of claim 1, wherein the at least one primary subtrace is substantially orthogonal to the main trace at a junction between the at least one primary subtrace and the main trace.

3. The capacitive sensor array of claim 1, wherein the at least one primary subtrace comprises at least two primary subtraces.

4. The capacitive sensor array of claim 3, wherein a first of the at least two primary subtraces has a different length than a second of the at least two primary subtraces.

5. The capacitive sensor array of claim 3, wherein the at least two primary subtraces branch from opposite sides of the main trace and are symmetrical about an axis of symmetry extending along a portion of the main trace.

6. The capacitive sensor array of claim 3, wherein the at least two primary subtraces branch from a same side of the main trace and are parallel.

7. The capacitive sensor array of claim 3, further comprising one or more dummy traces situated between the at least two primary subtraces, wherein each of the one or more dummy traces comprises conductive material that is electrically isolated from both the first plurality of sensor elements and the second sensor element.

8. The capacitive sensor array of claim 1, further comprising one or more dummy traces between each of the first plurality of sensor elements, wherein the one or more dummy traces comprise conductive material that is electrically isolated from both the first plurality of sensor elements and the second sensor element.

9. A capacitive sensor array, comprising:
   a first plurality of sensor elements, wherein each of the first plurality of sensor elements comprises a core trace, wherein for each sensor element of the first plurality of sensor elements, the core trace of the sensor element is wider than any other trace of the sensor element; and
   a second sensor element capacitively coupled to each of the first plurality of sensor elements, wherein the second sensor element comprises:
   a main trace, and a plurality of primary subtraces branching away from the main trace, wherein the main trace intersects the core trace of each of the first plurality of sensor elements at a corresponding bridge to form a plurality of unit cells, wherein each of the plurality of unit cells designates an area corresponding to an intersection between the second sensor element and one of the first plurality of sensor elements, wherein a contiguous section of the main trace crosses at least one of the plurality of unit cells, and wherein a contiguous section of the core trace of each of the first plurality of sensor elements crosses at least one of the plurality of unit cells.

10. The capacitive sensor array of claim 9, wherein, for each of the plurality of unit cells, each point within the unit cell is nearer to the intersection corresponding to the unit cell than to any other intersection between the second sensor element and one of the first plurality of sensor elements, and wherein the main trace extends across each of the plurality of unit cells.

11. The capacitive sensor array of claim 9, wherein each of the plurality of primary subtraces corresponds to one of the plurality of unit cells.

12. The capacitive sensor array of claim 9, wherein a first subtrace of the plurality of primary subtraces has a different length than a second subtrace of the plurality of primary subtraces.

13. The capacitive sensor array of claim 9, wherein at least one of the plurality of primary subtraces is parallel to another of the plurality of primary subtraces branching from a same side of the main trace, and wherein the at least one primary subtrace is substantially orthogonal to the main trace at a junction between the at least one primary subtrace and the main trace.

14. The capacitive sensor array of claim 9, further comprising one or more dummy traces situated between a first subtrace of the plurality of primary subtraces and a second subtrace of the plurality of primary subtraces, wherein each of the one or more dummy traces comprises conductive material that is electrically isolated from both the first plurality of sensor elements and the second sensor element.

15. The capacitive sensor array of claim 9, comprising one or more bridges joining portions of at least one core trace.

16. The capacitive sensor array of claim 9, further comprising one or more dummy traces situated between at least one of the first plurality of sensor elements and the second sensor element, wherein the one or more dummy traces comprise conductive material that is electrically isolated from both the first plurality of sensor elements and the second sensor element.

17. A capacitive touch-sensing system, comprising:
   a capacitive sensor array, comprising:
   a first plurality of sensor elements, wherein each of the first plurality of sensor elements comprises a core trace, wherein for each sensor element of the first plurality of sensor elements, the core trace of the sensor element is wider than any other trace of the sensor element, and a second sensor element comprising a main trace, wherein the main trace intersects the core trace of each of the first plurality of sensor elements at a corresponding bridge to form a plurality of unit cells, wherein each of the plurality of unit cells designates an area corresponding to an intersection between the second sensor element and one of the first plurality of sensor elements, wherein a contiguous section of the main trace crosses at least one of the plurality of unit cells, and wherein, within each unit cell, the second sensor element comprises at least one primary subtrace branching away from the main trace; and
   a capacitance sensor coupled with the capacitive sensor array, wherein the capacitance sensor is configured to measure a mutual capacitance for each intersection between the second sensor element and one of the first plurality of sensor elements.

18. The capacitive touch-sensing system of claim 17, wherein the at least one primary subtrace is substantially orthogonal to the main trace at a junction between each of the at least one primary subtrace and the main trace.

19. The capacitive touch-sensing system of claim 17, wherein the at least one primary subtrace comprises at least two primary subtraces branching away from the main trace from opposite sides of the main trace, and wherein the at least two primary subtraces are symmetrical about an axis of symmetry extending along a portion of the main trace.

20. The capacitive touch-sensing system of claim 17, further comprising one or more dummy traces situated between the second sensor element and at least one of the first plurality of sensor elements, wherein the one or more dummy traces comprise conductive material that is electrically isolated from both the first plurality of sensor elements and the second sensor element.

* * * * *